(12) United States Patent
Takano

(10) Patent No.: US 9,691,535 B2
(45) Date of Patent: Jun. 27, 2017

(54) FILTER DEVICE

(71) Applicant: FUJI ELECTRIC CO., LTD., Kawasaki-shi, Kanagawa (JP)

(72) Inventor: Makoto Takano, Suzuka (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/847,696

(22) Filed: Sep. 8, 2015

(65) Prior Publication Data

US 2015/0380147 A1 Dec. 31, 2015

Related U.S. Application Data

(63) Continuation of application No. PCT/JP2014/070120, filed on Jul. 30, 2014.

(30) Foreign Application Priority Data

Sep. 6, 2013 (JP) ................................. 2013-185255

(51) Int. Cl.
*H01F 27/08* (2006.01)
*H03H 7/01* (2006.01)
(Continued)

(52) U.S. Cl.
CPC ............. *H01F 27/08* (2013.01); *H01F 27/02* (2013.01); *H01F 27/025* (2013.01);
(Continued)

(58) Field of Classification Search
CPC .......... H01F 27/02; H01F 27/08; H01F 27/24; H01F 27/48; H03H 7/17; H02M 5/40–5/48
See application file for complete search history.

(56) References Cited

U.S. PATENT DOCUMENTS 6,075,425 A * 6/2000 Gopfrich ................. H02M 1/12
   307/105
7,746,020 B2 * 6/2010 Schnetzka ............. F25B 49/025
   318/611
(Continued)

FOREIGN PATENT DOCUMENTS

CN 101397015 A 4/2009
CN 102332808 A 1/2012
(Continued)

OTHER PUBLICATIONS

PCT, "International Search Report for International Application No. PCT/JP2014/070120".

(Continued)

*Primary Examiner* — Dean Takaoka
*Assistant Examiner* — Alan Wong
(74) *Attorney, Agent, or Firm* — Manabu Kanesaka

(57) ABSTRACT

A filter device is electrically connected between a power supply and a power converter including a converter unit for rectifying inputs and an inverter unit for inversely converting outputs of the converter unit. The filter device includes a casing; a filter reactor housed inside the casing, for removing a high-frequency component; and a booster reactor housed inside the casing and disposed below the filter reactor, for boosting a voltage of a current having passed through the filter reactor. The booster reactor includes an iron core, a coil wound around the iron core, and a spacer interposed between inner and outer circumferential portions of the coil to form an air passage for passing air introduced into the casing. The booster reactor is stored in the casing so that the air that has passed through the air passage passes through a periphery of the filter reactor disposed immediately above the booster reactor.

8 Claims, 9 Drawing Sheets

(51) Int. Cl.
*H02J 3/01* (2006.01)
*H02M 1/12* (2006.01)
*H01F 27/02* (2006.01)
*H01F 27/32* (2006.01)
*H01F 27/24* (2006.01)
*H01F 27/28* (2006.01)
*H02M 5/42* (2006.01)
*H02M 7/00* (2006.01)

(52) U.S. Cl.
CPC ........... *H01F 27/085* (2013.01); *H01F 27/24* (2013.01); *H01F 27/28* (2013.01); *H01F 27/324* (2013.01); *H02J 3/01* (2013.01); *H02M 1/126* (2013.01); *H02M 5/42* (2013.01); *H03H 7/17* (2013.01); *H02M 7/003* (2013.01); *Y02E 40/40* (2013.01)

(56) References Cited

U.S. PATENT DOCUMENTS

| | | | | |
|---|---|---|---|---|
| 8,325,500 | B2 * | 12/2012 | Schueneman | H02M 1/126 363/47 |
| 8,575,479 | B2 * | 11/2013 | Abolhassani | H01F 7/06 174/17 VA |
| 8,773,851 | B2 * | 7/2014 | Shigeno | H05K 7/20918 165/185 |
| 9,318,253 | B2 * | 4/2016 | Rozman | H01F 27/24 |
| 9,462,727 | B2 * | 10/2016 | Shirouzu | H05K 7/20127 |
| 2011/0215890 | A1 | 9/2011 | Abolhassani et al. | |
| 2012/0250255 | A1 | 10/2012 | Shigeno et al. | |

FOREIGN PATENT DOCUMENTS

| | | |
|---|---|---|
| CN | 102739074 A | 10/2012 |
| JP | S57-4216 U | 1/1982 |
| JP | S57-44521 U | 3/1982 |
| JP | H08-88490 A * | 4/1996 |
| JP | H08-088490 A | 4/1996 |
| JP | 2005-287183 A | 10/2005 |
| JP | 2012-210115 A | 10/2012 |

OTHER PUBLICATIONS

China Patent Office, "Office Action for Chinese Patent Application No. 201480012967.X," Dec. 26, 2016.

* cited by examiner

US 9,691,535 B2

FILTER DEVICE

CROSS-REFERENCES TO RELATED APPLICATIONS

The present application is a Continuation Application of PCT International Application No. PCT/JP2014/070120 filed Jul. 30, 2014, and claiming priority from Japanese Application No. 2013-185255 filed Sep. 6, 2013, the disclosure of which is incorporated herein.

TECHNICAL FIELD

The present invention relates to a filter device.

BACKGROUND ART

There has been known a technique for suppressing the high-frequency currents by electrically connecting a filter reactor and a booster reactor between a power supply and a power converter having a converter unit for rectifying the inputs and an inverter unit for inversely converting the outputs of the converter unit. Such filter reactor and booster reactor are typically disposed separately in the vicinity of the place where the power converter is installed.

For the purpose of reducing the number of installation spaces and the wiring workload, a structure in which a filter reactor and the like are incorporated in a single module has been proposed (see Patent Literature 1, for example).
Patent Literature 1: Japanese Patent Application Publication No. 2005-287183

DISCLOSURE OF THE INVENTION

Although Patent Literature 1 describes that a filter reactor and the like are incorporated in a single module, a specific structure thereof is not described therein. In addition, when placing the filter reactor and the like within a casing, it is preferred that the casing be small in view of the transport thereof and that the reactor and the like be cooled favorably.

In view of the forgoing circumstances, an object of the present invention is to provide a filter device that is structured to accomplish size reduction of the entire device and to favorably cool a filter reactor and a booster reactor therein.

In order to achieve the foregoing object, a filter device according to the present invention is electrically connected between a power supply and a power converter that includes a converter unit for rectifying inputs and an inverter unit for inversely converting outputs of the converter unit. In the filter device, a filter reactor for removing a high-frequency component and a booster reactor for boosting a voltage of a current having passed through the filter reactor are stored in a casing. The booster reactor forms an air passage for air introduced into the casing, between an inner circumferential portion and an outer circumferential portion of a coil by wrapping the coil around an iron core, with spacers interposed appropriately, and is stored in the casing in such a manner that air that has passed through the air passage passes through a periphery of the filter reactor disposed immediately above the booster reactor.

The filter device according to the present invention is also characterized by having air blowing means for drawing external air into the casing through an inlet formed in the casing and blowing the air that has passed through the inside of the casing to the outside through an outlet formed in the casing, and a guide member that is disposed inside the casing and guides, to the air passage, the air that is drawn through the inlet.

The filter device according to the present invention further includes a filter resistor member for allowing the passage of a current with a high-frequency component that is removed by the filter reactor, wherein the filter resistor member is disposed in a passage region of the air that has passed through the periphery of the filter reactor.

The filter device according to the present invention further includes a filter capacitor for accumulating a current with a high-frequency component that has passed through the filter resistor member, wherein the filter capacitor is disposed in a chamber partitioned from a chamber in which the filter reactor and the booster reactor are stored.

According to the present invention, the booster reactor forms an air passage for air introduced into the casing, between the inner circumferential portion and the outer circumferential portion of a coil by wrapping the coil around an iron core, with spacers interposed appropriately, and is stored in the casing in such a manner that air that has passed through the air passage passes through the periphery of the filter reactor disposed immediately above the booster reactor. This means that the booster reactor is stored in the casing in a vertical arrangement with respect to the filter reactor. Accordingly, the width of the place where the filter reactor and the booster reactor are installed can be reduced sufficiently, resulting in a reduction of the width of the casing. Moreover, because the booster reactor allows the passage of air to the air passage formed by the booster reactor, the area of contact between the air passage and the air can be expanded, increasing the heat dissipation area. Therefore, while reducing the size of the entire filter device, the effect of favorably cooling the filter reactor and the booster reactor can be achieved.

BEST MODE FOR CARRYING OUT THE INVENTION

A preferred embodiment of the filter device according to the present invention is described hereinafter in detail with reference to the accompanying drawings.

Figure 1:
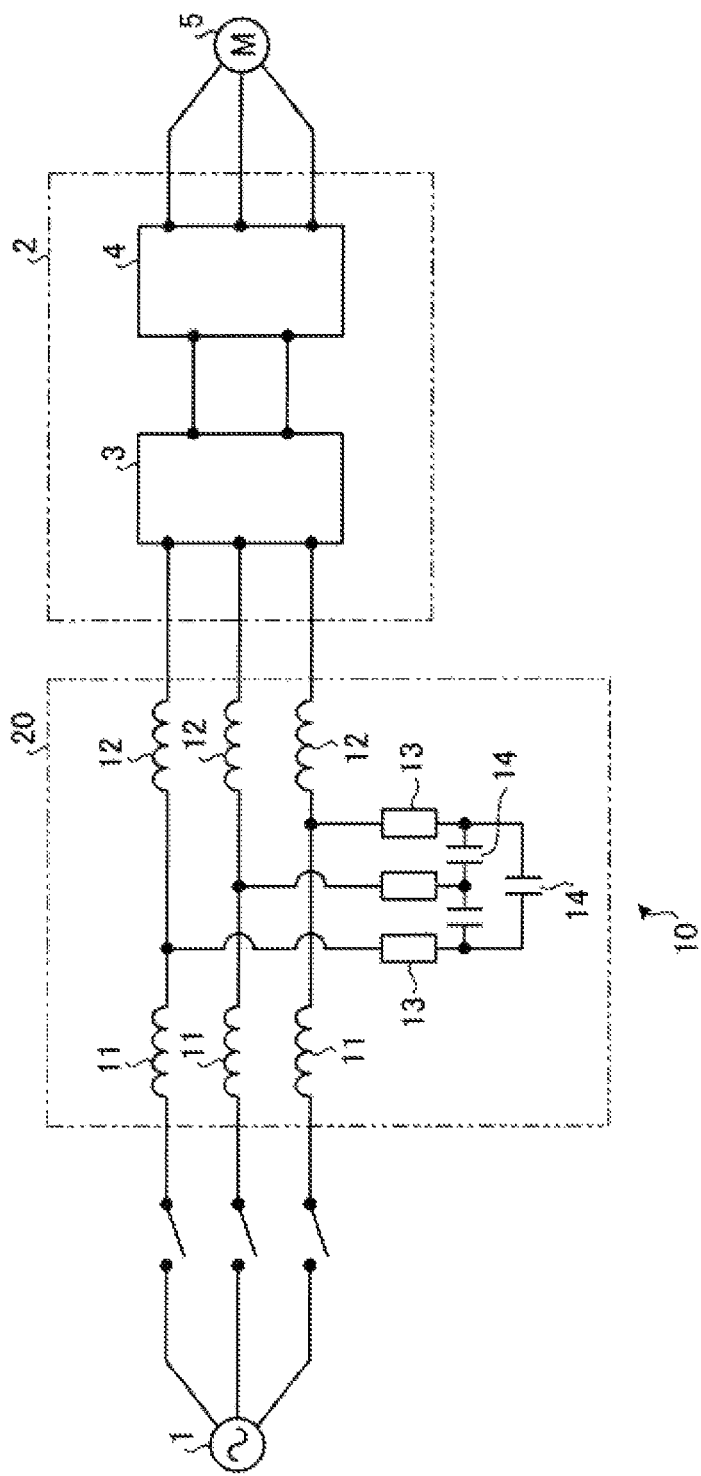
FIG. 1 is a connection diagram to which a filter device according to an embodiment of the present invention is applied.

FIG. 1 is a connection diagram to which a filter device according to an embodiment of the present invention is applied. As shown in FIG. 1, a filter device 10 is electrically connected between an AC power supply 1 and a power converter 2. The power converter 2 has a converter unit 3 that converts an AC current into a DC current and an inverter unit 4 that converts the DC current output from the converter unit 3 into an AC current to drive a load 5 such as a motor. The converter unit 3 and the inverter unit 4 are stored in separate, dedicated casings.

The filter device 10 has a filter main body 20 as a casing for storing filter reactors 11, booster reactors 12, filter resistor members 13, and filter capacitors 14.

The filter reactors 11 remove a specific high-frequency component. The booster reactors 12 boost the voltage of a current that has passed through the filter reactors 11. The filter resistor members 13 allow the passage of a current having a high-frequency component that is removed by the filter reactors 11. The filter capacitors 14 accumulate the current having a high-frequency component that has passed through the filter resistor members 13.

Figure 2:
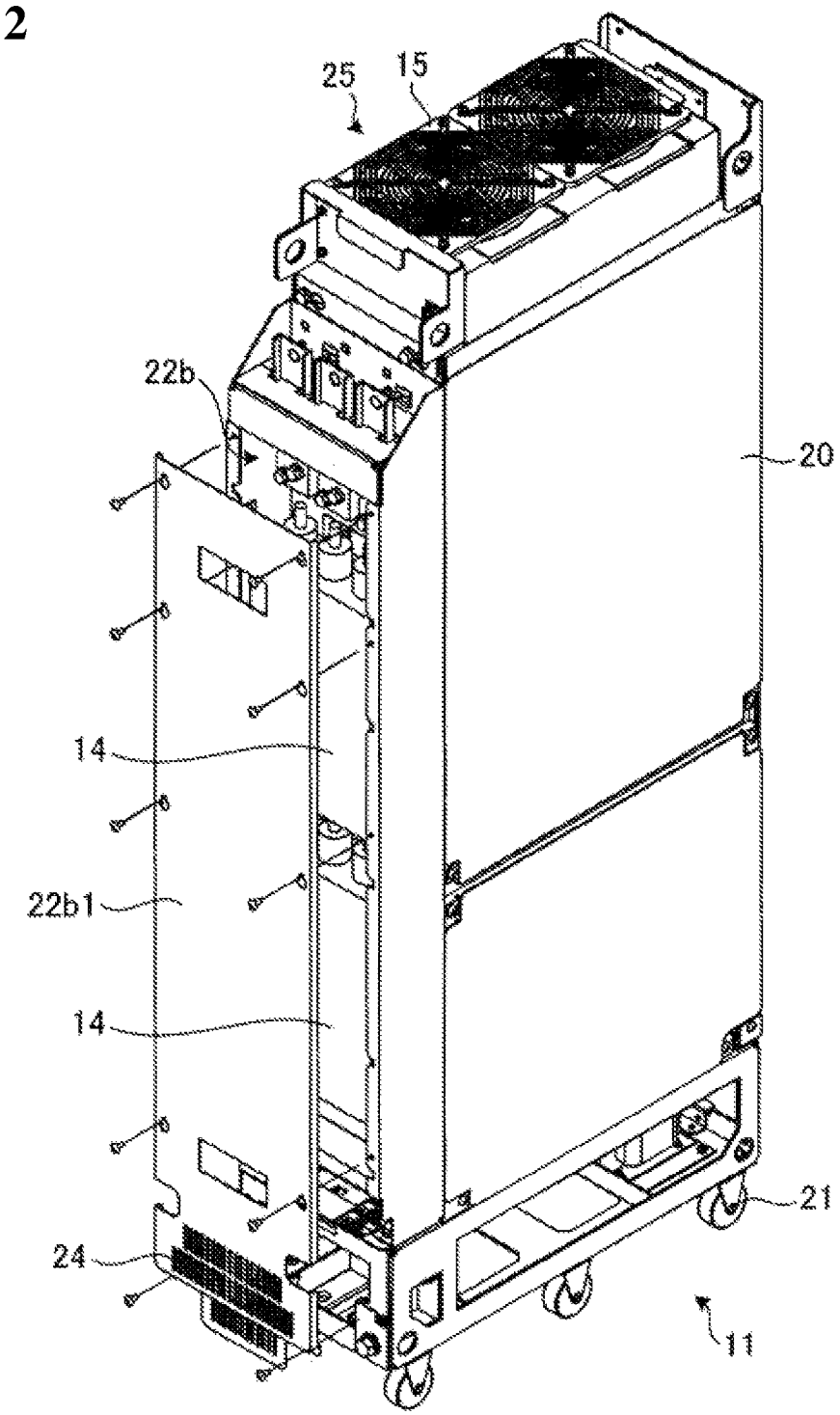
FIG. 2 is a perspective view showing the exterior of the filter device shown in FIG. 1.
Figure 3:
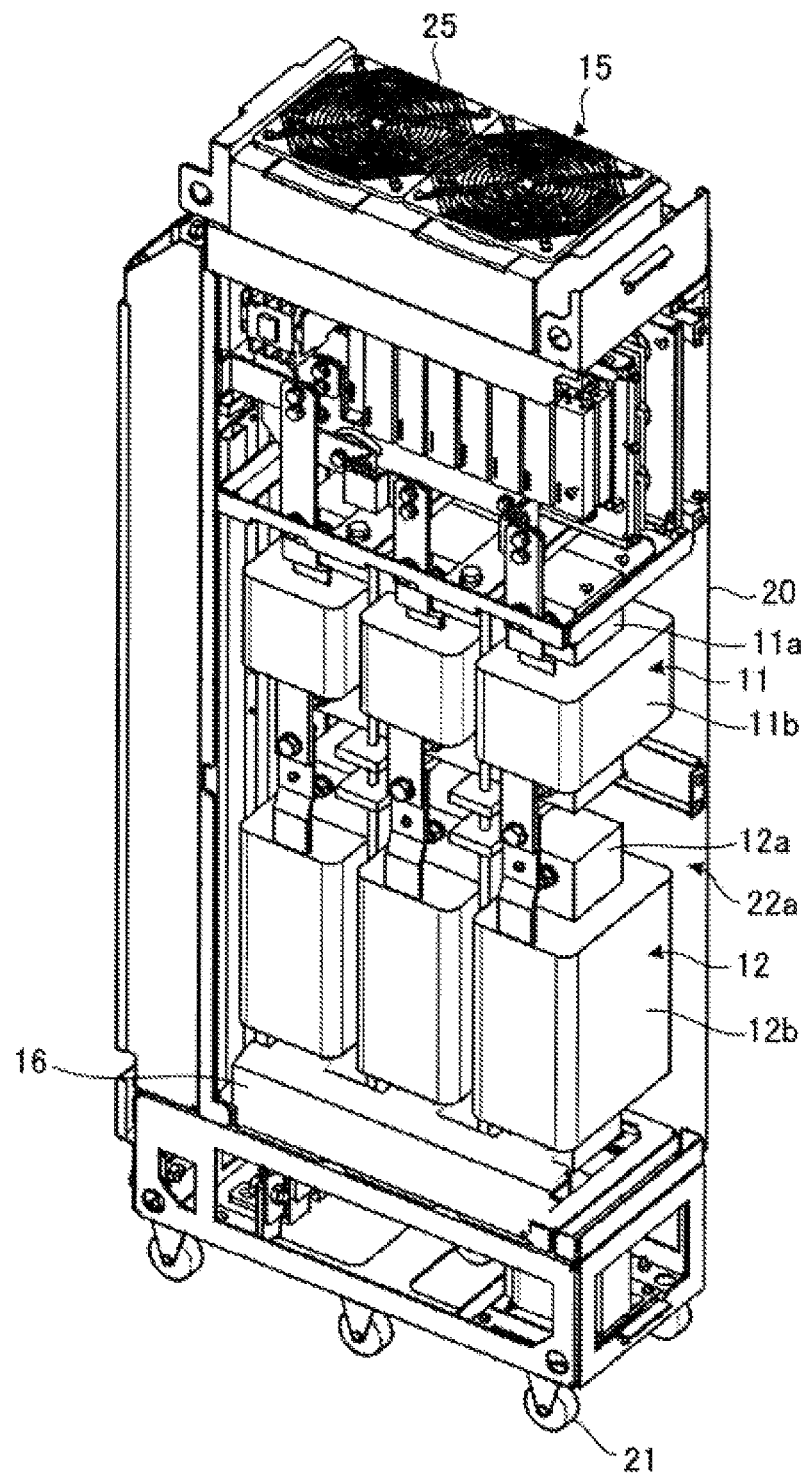
FIG. 3 is a perspective view showing an internal structure of the filter device.
Figure 4:
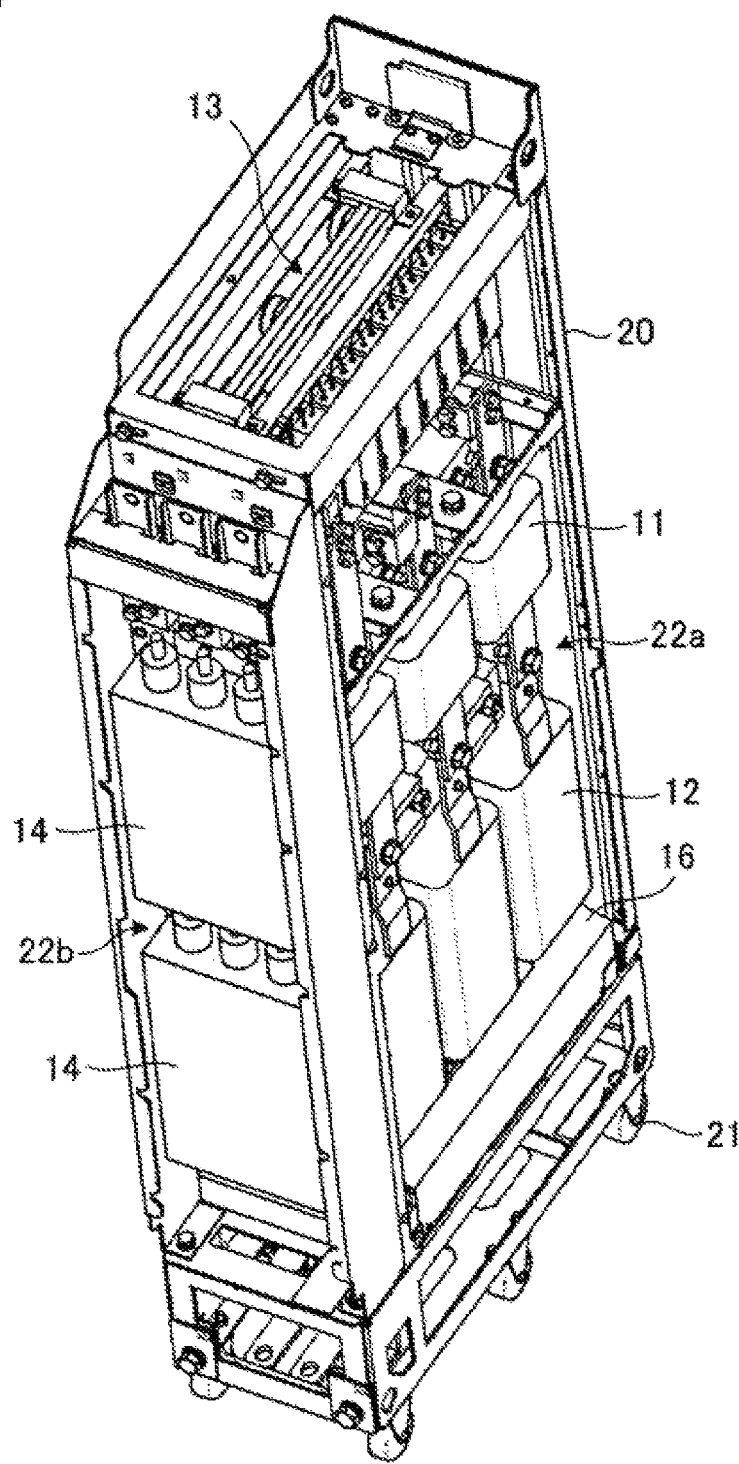
FIG. 4 is a perspective view showing the internal structure of the filter device.
Figure 5:
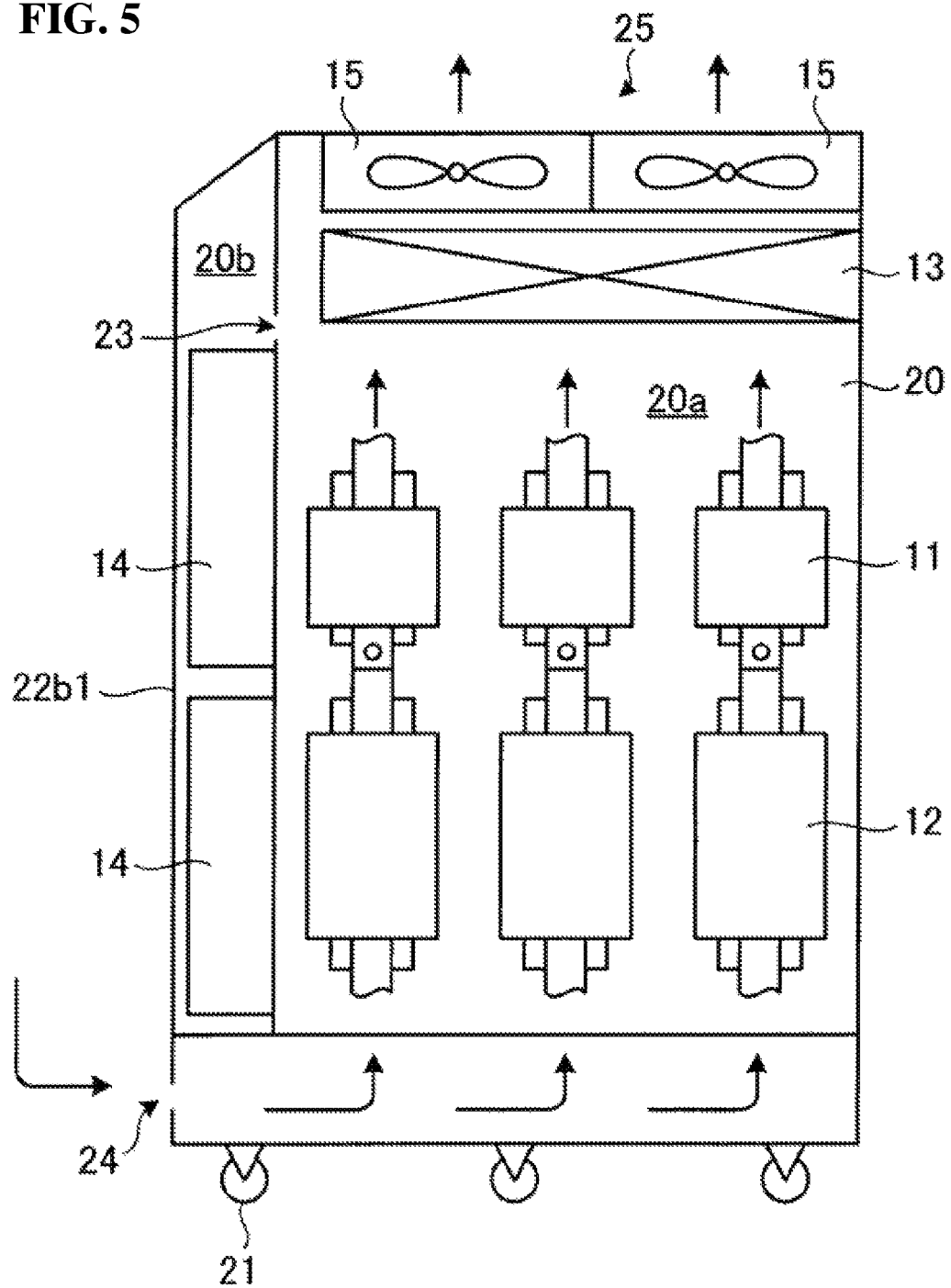
FIG. 5 is a schematic diagram schematically showing a structure of the filter device.

FIG. 2 is a perspective view showing the exterior of the filter device shown in FIG. 1. FIGS. 3 and 4 are each a perspective view showing the internal structure of the filter device. FIG. 5 is a schematic diagram schematically showing a structure of the filter device.

As shown in FIGS. 2 to 5, the filter main body 20 can be moved on wheels 21 attached to the lower end portion of the filter main body 20, and has two separate chambers 22a, 22b. In this filter main body 20, the filter reactors 11, booster reactors 12, and filter resistor members 13 are disposed in the chamber 22a (also referred to as "rear chamber 22a," hereinafter), while the filter capacitors 14 are disposed in the chamber 22b (also referred to as "front chamber 22b," hereinafter). These two chambers 22a, 22b communicate with each other by an upper opening 23.

The filter main body 20 is also provided with an inlet 24 and an outlet 25. The inlet 24 is formed in the lower portion of a front cover 22b1 that closes the front chamber 22b in which the filter capacitors 14 are disposed, and communicates with the rear chamber 22a in which the filter reactors 11 and the like are disposed. The outlet 25 is an opening formed in an upper surface of the rear chamber 22a and is arranged with cooling fans 15.

When driven in response to a drive command, each of the cooling fans 15 functions as the air blowing means for drawing external air into the filter main body 20 through the inlet 24 and blowing the air, which has passed through the filter main body 20, to the outside through the outlet 25.

Figure 6:
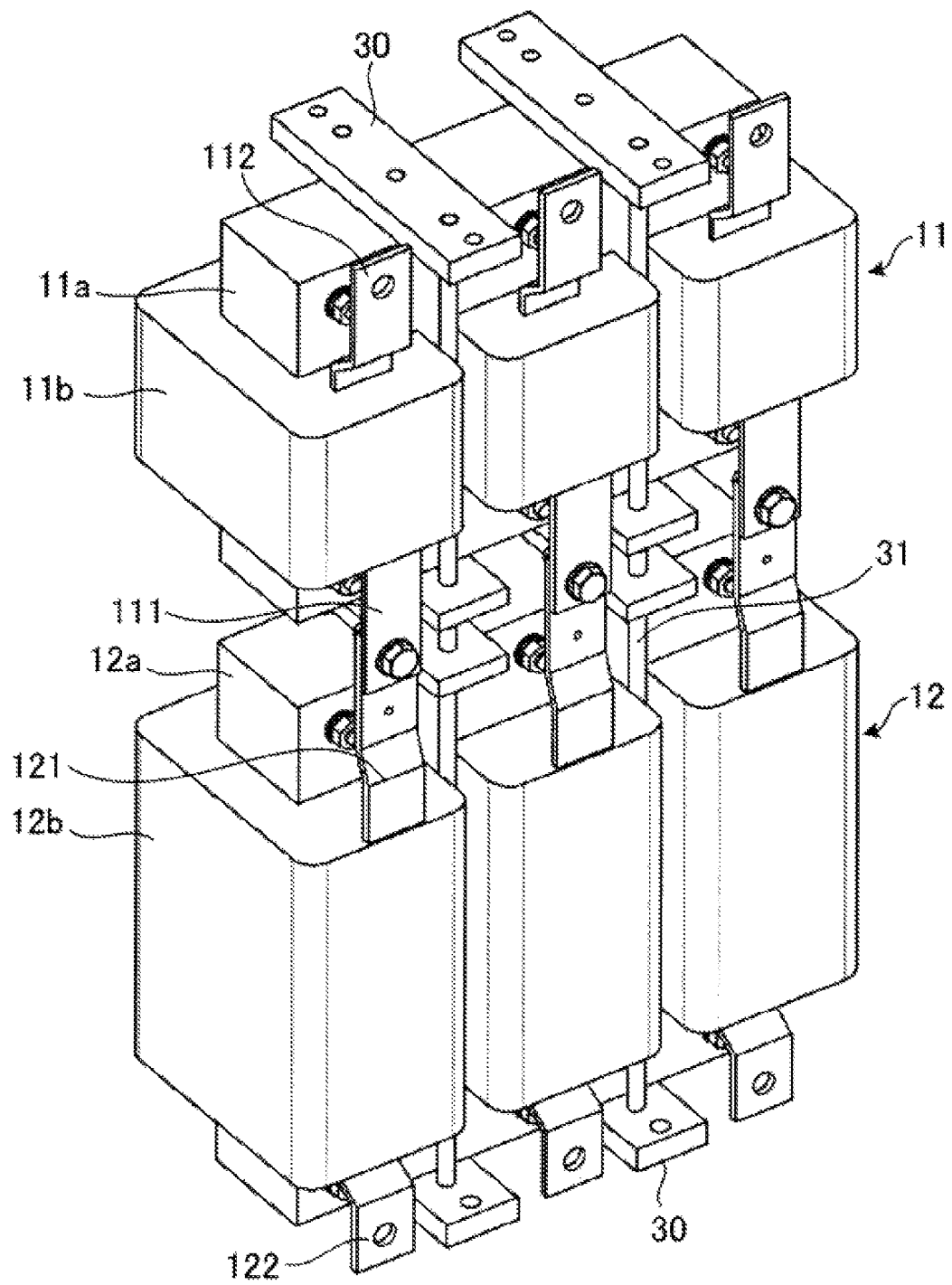
FIG. 6 is a perspective view showing filter reactors and booster reactors that are shown in FIG. 1.

FIG. 6 is a perspective view showing the filter reactors and booster reactors that are shown in FIG. 1. The filter reactors 11 and the booster reactors 12 are disposed, in which those filter reactors and boosting reactors that are electrically connected to each other by a common wiring system are disposed in vertical arrangement. More specifically, support plates 30 and support bars 31 are provided in such a manner that the filter reactors 11 are supported immediately above the booster reactors 12. Here, the booster reactors 12 are disposed below the respective filter reactors 11 because the booster reactors 12 are heavier than the filter reactors 11.

The filter reactors 11 and the booster reactors 12 are each structured by wrapping a coil 11b, 12b around an iron core 11a, 12a, as in the conventional art. A conductor bar 111 provided at one end of the coil 11b of the corresponding filter reactor 11 is coupled to a conductor bar 121 provided at one end of the coil 12b of the corresponding booster reactor 12, thereby electrically connecting the filter reactor 11 to the booster reactor 12. A conductor bar 112 is brazed to the other end of the coil 11b of the corresponding filter reactor 11, and is electrically connected to the corresponding filter resistor member 13. A conductor bar 122 is brazed to the other end of the coil 12b of the corresponding booster reactor 12, and is electrically connected to the converter unit 3 of the power converter 2 by an output terminal, not shown.

Figure 7:
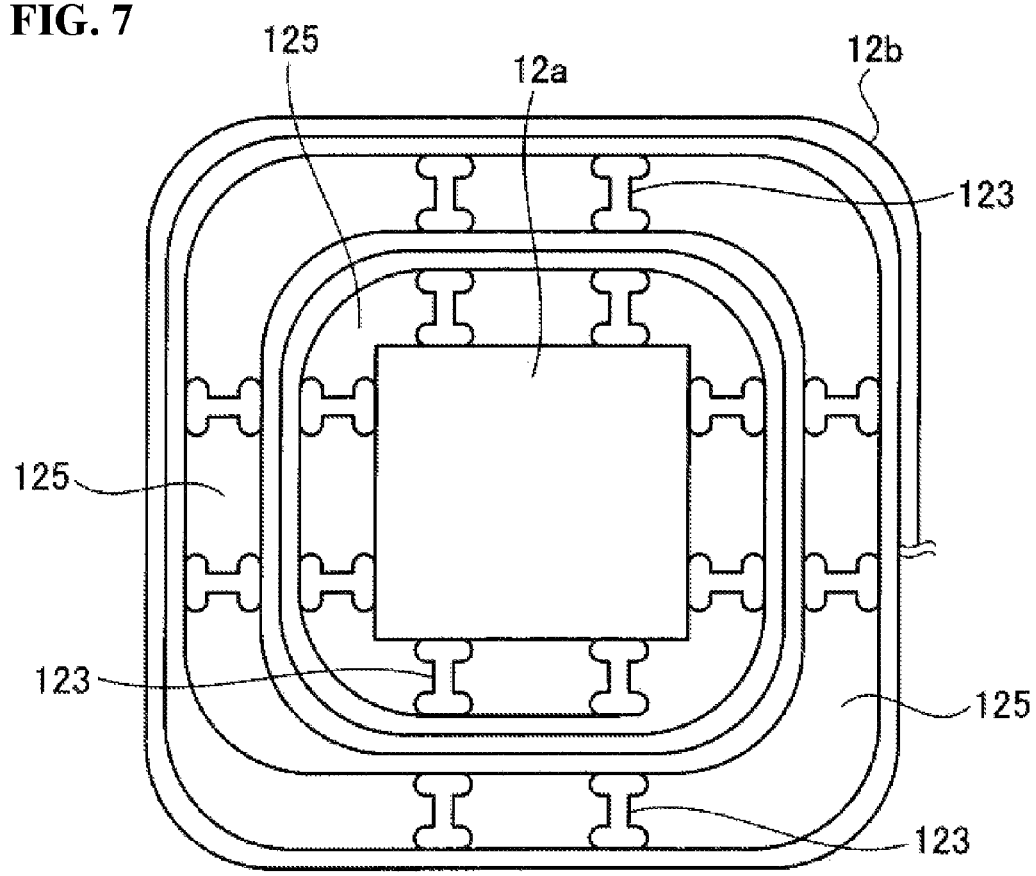
FIG. 7 is a plan view showing an internal structure of the booster reactor.

Incidentally, the booster reactors 12 are designed as follows. Specifically, as shown in FIG. 7, each of the booster reactors 12 forms an air passage 125 for air introduced to the filter main body 20, between the iron core 12a and the coil 12b as well as between the inner circumferential portion and the outer circumferential portion of the coil 12b by wrapping the coil 12b around the iron core 12a, with spacers 123 made of an insulating material being interposed appropriately.

Below the booster reactors 12 is a guide member 16. The guide member 16, formed by appropriately bending a steel plate or an insulating material, guides the air entering the filter main body 20 through the inlet 24 to the air passage 125 as the cooling fans 15 are driven.

As with the booster reactors 12, the filter reactors 11 may each form an air passage (not shown) for the air introduced into the filter main body 20, between the iron core 11a and the coil 11b by wrapping the coil 11b around the iron core 11a, with spacers (not shown) made of an insulating material being interposed appropriately.

Figure 9:
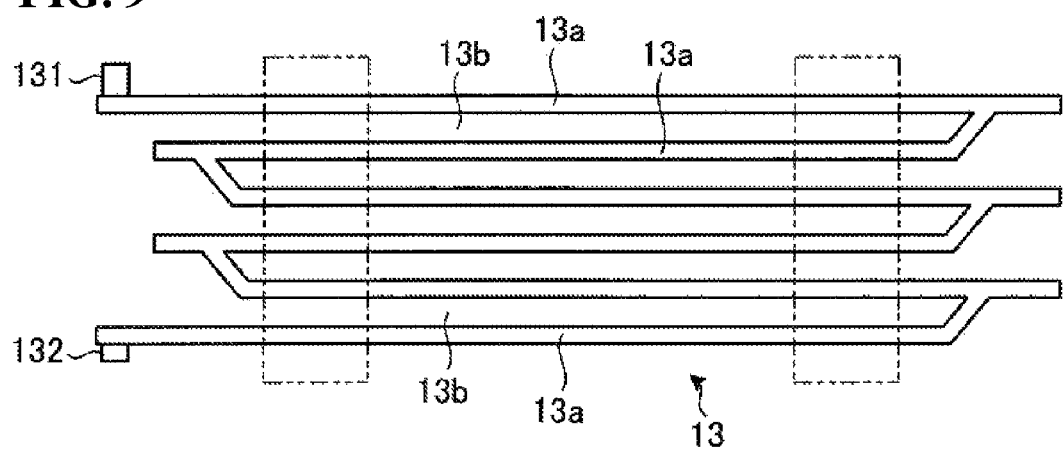
FIG. 9 is a plan view showing a structure of a filter resistor member.

The filter resistor members 13 are disposed above the filter reactors 11 and below the cooling fans 15. The filter resistor members 13 generate the most heat and are therefore disposed at the furthest downstream side of the flow of the air passing through the filter main body 20. The filter resistor members 13 are each structured by arranging a plurality of flat members 13a horizontally, in which a pathway 13b through which the air passes through are formed between the flat members 13a, as shown in FIG. 9. One end 131 is electrically connected to each filter reactor 11, and the other end 132 is electrically connected to each filter capacitor 14. A wiring system that is electrically connected to the filter capacitor 14 passes through the upper opening 23.

The filter capacitors 14 are disposed in the front chamber 22b, different from the chamber for storing the filter reactors 11, booster reactors 12, and filter resistor members 13. This is because the filter capacitors 14 generate less heat than the filter reactors 11, booster reactors 12, and filter resistor members 13, and because the filter capacitors 14 need to be unaffected by the heat generated by the filter reactors 11, booster reactors 12, and filter resistor members 13.

Figure 8:
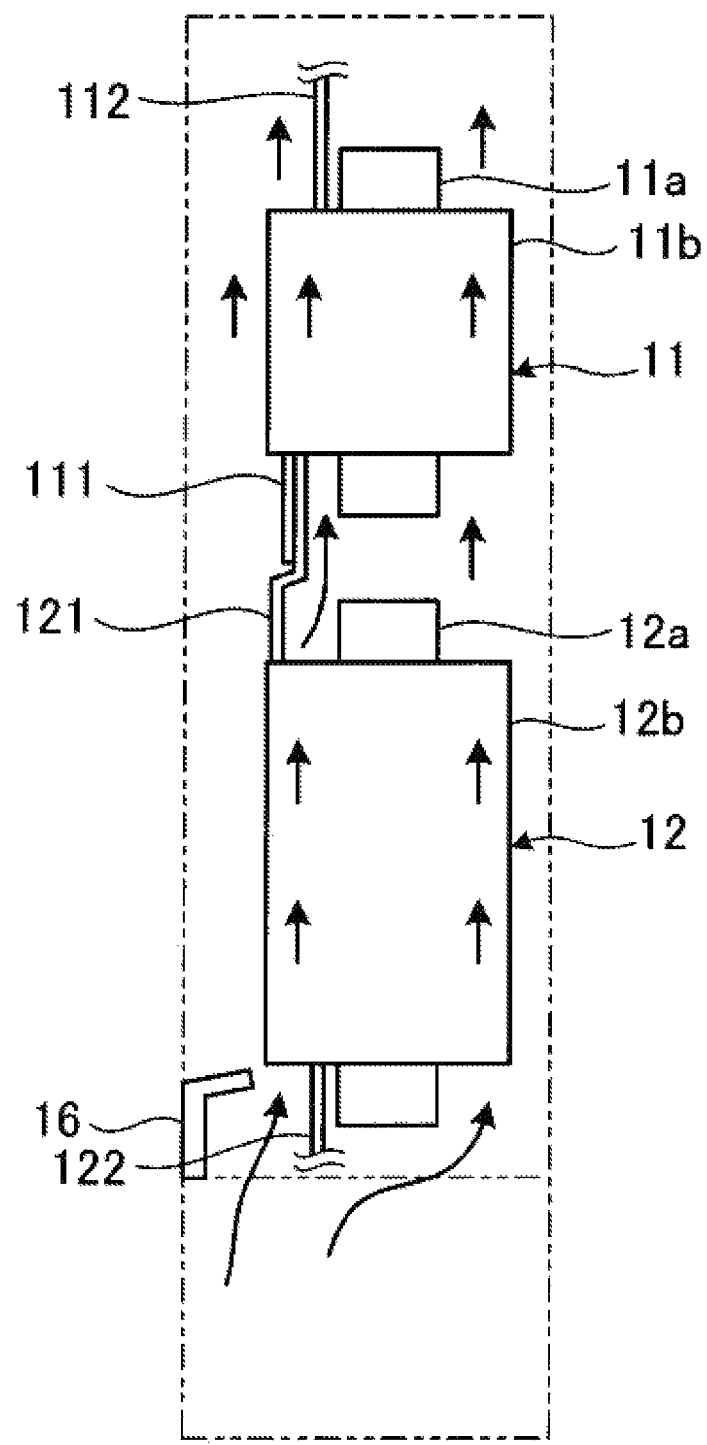
FIG. 8 is a schematic diagram schematically showing the back of the internal structure of a filter main body.

In the filter device 10 having the foregoing structure, when the cooling fans 15 are driven, the external air enters the filter main body 20 through the inlet 24, as shown in FIG. 5. The air that enters the filter main body 20 passes through the inside of the filter main body 20 toward the outlet 25 and is guided to the air passage 125 of each booster reactor 12 by the guide member 16 as shown in FIG. 8 to pass through the air passage 125 of each booster reactor 12. After passing through the air passages 125 of the booster reactors 12, the air passes through the periphery of each filter reactor 11, then passes through the periphery of each filter resistor member 13, and is blown out of the outlet 25 to the outside.

The booster reactors 12 are cooled by the passage of the air through the air passages 125, and the filter reactors 11 are cooled by the passage of the air through the booster reactors 12. The filter resistor members 13 are cooled by the passage of the air through the filter reactors 11.

Incidentally, in the front chamber 22b in which the filter capacitors 14 are disposed, driving the cooling fans 15 draws the internal air into the cooling fans 15 through the upper opening 23 and blows the air to the outside. As a result, the filter capacitors 14 that generate less heat than the booster reactors 12 and the like are also cooled by the passage of the air therethrough.

According to the filter device 10 of the embodiment of the present invention described above, each of the booster reactors 12 forms the air passage 125 between the inner circumferential portion and the outer circumferential portion of the coil 12b by wrapping the coil 12b around the iron core 12a, with the spacers 123 being interposed appropriately. The booster reactors 12 are stored in the filter device 10 in such a manner that the air that has passed through the air passages 125 passes through the periphery of each of the filter reactors 11 disposed immediately above the booster reactors 12. In other words, the booster reactors 12 are stored in a vertical arrangement with respect to the filter reactors 11. Such a structure can sufficiently reduce the width of the place where the filter reactors 11 and booster reactors 12 are disposed, as well as the width of the filter main body 20. Moreover, the booster reactors 12 allow the passage of the air through the air passages 125 formed by the booster reactors 12, so that the area of contact between the air passages and the air increases, and hence, increasing the heat dissipation area. Therefore, while reducing the size of the entire device, it is possible to favorably cool the filter reactors 11 and the booster reactors 12.

According to the filter device 10, when the cooling fans 15 are driven, the cooling fans 15 draw the external air into the filter main body 20 through the inlet 24 and blow the air, which has passed through the inside of the filter main body 20, to the outside through the outlet 25, in which the guide member disposed in the filter main body 20 guides the air drawn through the inlet 24 to the air passages 125. Therefore, the air that is drawn from the outside can be guided to the air passages 125 efficiently. In addition, the efficiency of cooling the filter reactors 11 and the booster reactors 12 can be improved by increasing the amount of air passing through the air passages 125.

According to the filter device 10, the filter resistor members 13 are disposed in the region where the air, which has passed through the peripheries of the filter reactors 11, passes through. Therefore, the air that has passed through the filter resistor members 13 generating the most heat does not pass through the peripheries of the filter reactors 11 and the like, achieving favorable cooling of the filter reactors 11 and booster reactors 12.

According to the filter device 10, the filter capacitors 14 are disposed in the front chamber 22b that is partitioned from the rear chamber 22a for storing the filter reactors 11 and the booster reactors 12. This structure can prevent the filter capacitors 14 from being affected negatively by the heat generated by the heat generating elements of the filter reactors 11 and the like.

A preferred embodiment of the present invention was described above. However, the present invention is not limited thereto, and various changes can be made to the present invention.

According to the foregoing embodiment, the guide member 16 is disposed below the booster reactors 12. In the present invention, however, a guide member for guiding, to the air passages of the filter reactors 11, the air that has passed through the booster reactors 12 may be disposed below the filter reactors 11.

According to the foregoing embodiment, the cooling fans 15 are disposed above the rear chamber 22a as components of the outlet 25. In the present invention, however, the air blowing means may be disposed anywhere in the casing.

EXPLANATION OF REFERENCE NUMERALS

1 AC power supply
2 Power converter
3 Converter unit
4 Inverter unit
10 Filter device
11 Filter reactor
11a Iron core
11b Coil
12 Booster reactor
12a Iron core
12b Coil
123 Spacer
125 Air passage
13 Filter resistor member
14 Filter capacitor
15 Cooling fan
16 Guide member
20 Filter main body
21 Wheel
22a Rear chamber
22b Front chamber
23 Upper opening
24 Inlet
25 Outlet

What is claimed is:

1. A filter device electrically connected between a power supply and a power converter including a converter unit for rectifying inputs and an inverter unit for inversely converting outputs of the converter unit, the filter device comprising:
   a casing;
   a filter reactor housed inside the casing, for removing a high-frequency component; and
   a booster reactor housed inside the casing and disposed below the filter reactor, for boosting a voltage of a current having passed through the filter reactor, the booster reactor including
      an iron core,
      a coil wound around the iron core, and
      a spacer interposed between an inner circumferential portion and an outer circumferential portion of the coil to form an air passage therebetween for passing air introduced into the casing,
   wherein the booster reactor disposed below the filter reactor is heavier than the filter reactor, and
   the booster reactor is arranged in the casing so that the air that has passed through the air passage passes through a periphery of the filter reactor disposed immediately above the booster reactor.

2. The filter device according to claim 1, further comprising:
   an air blowing device for drawing the air from outside into the casing through an inlet formed in the casing, and blowing the air that has passed through the inside of the casing to the outside through an outlet formed in the casing; and
   a guide member disposed inside the casing, for guiding the air drawn through the inlet to the air passage.

3. The filter device according to claim 2, further comprising a filter resistor member disposed in a passage region of the air that has passed through the periphery of the filter reactor, for allowing the current with high-frequency component removed by the filter reactor to pass therethrough.

4. The filter device according to claim 1, further comprising a filter resistor member disposed in a passage region of the air that has passed through the periphery of the filter reactor, for allowing the current with high-frequency component removed by the filter reactor to pass therethrough.

5. The filter device according to claim 4, further comprising a filter capacitor disposed in a chamber of the casing partitioned from another chamber housing the filter reactor and the booster reactor, for accumulating the current with high-frequency component removed by the filter reactor.

6. The filter device according to claim 5, wherein the casing includes the inlet at a lower side of the casing, and the outlet at a top of the casing, the guide member is located at a lower portion of the casing under the chamber housing the filter capacitor and the another chamber housing the filter reactor and the booster reactor, and communicates the inlet and the another chamber, the air blowing device is disposed under the outlet inside the casing, and the filter resistor member generates heat and is disposed immediately below the air blowing device above the another chamber.

7. The filter device according to claim 6, wherein the booster reactor further includes another spacer disposed between the iron core and the coil to form another air passage between the iron core and the coil.

8. The filter device according to claim 7, wherein the filter reactor includes a filter coil and a filter conductor bar connected to the filter coil, and the booster reactor further includes a booster conductor bar connected to the coil of the booster reactor and the filter conductor bar.

* * * * *